(12) United States Patent
He

(10) Patent No.: US 10,386,402 B2
(45) Date of Patent: Aug. 20, 2019

(54) SHOE AND METHOD FOR DETECTING ELECTRICAL LEAKAGE USING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Wen-Ru He, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 111 days.

(21) Appl. No.: 15/795,259

(22) Filed: Oct. 27, 2017

(65) Prior Publication Data
US 2019/0064244 A1 Feb. 28, 2019

(30) Foreign Application Priority Data
Aug. 23, 2017 (CN) .......................... 2017 1 0727959

(51) Int. Cl.
| | | |
|---|---|---|
| G01R 31/02 | (2006.01) | |
| G08B 21/18 | (2006.01) | |
| A43B 3/00 | (2006.01) | |
| G01R 31/28 | (2006.01) | |
| G01R 27/18 | (2006.01) | |

(52) U.S. Cl.
CPC ............ G01R 31/025 (2013.01); A43B 3/001 (2013.01); G08B 21/182 (2013.01); G01R 27/18 (2013.01); G01R 31/024 (2013.01); G01R 31/28 (2013.01)

(58) Field of Classification Search
CPC ...... G01R 31/00; G01R 31/02; G01R 31/024; G01R 31/025; G01R 31/08; G01R 31/28; G01R 27/00; G01R 27/02; G01R 27/16; G01R 27/18; G01R 19/00; G01R 19/0084; G01R 19/0092; A43B 3/00; A43B 3/0005; A43B 3/001; G08B 21/00; G08B 21/18; G08B 21/182
USPC ....... 324/500, 509, 510, 511, 512, 522, 537, 324/600, 602, 609, 649, 691, 713, 718, 324/76.11, 144; 361/1, 42
See application file for complete search history.

(56) References Cited

FOREIGN PATENT DOCUMENTS

| | | | |
|---|---|---|---|
| KR | 20080094157 A | * | 10/2008 |
| KR | 20090036732 A | * | 4/2009 |
| KR | 100950928 B1 | * | 4/2010 |

OTHER PUBLICATIONS

Machine Translation of KR-20090036732-A (Year: 2009).*

* cited by examiner

*Primary Examiner* — Hoai-An D. Nguyen
(74) *Attorney, Agent, or Firm* — ScienBiziP, P.C.

(57) ABSTRACT

A method for detecting an electrical leakage includes acquiring a voltage of a source of the electrical leakage detected by a voltage detector of a shoe when a walking user is wearing the shoe on a wet ground, and acquiring electromagnetic field strength between the source of the electrical leakage and the shoe, by a first induced circuit of the shoe. A distance between the shoe and the source of the electrical leakage is acquired and the voltage and distance sent to a mobile device as representing a danger when the voltage of the source of the electrical leakage is greater than the predetermined voltage.

11 Claims, 9 Drawing Sheets

SHOE AND METHOD FOR DETECTING ELECTRICAL LEAKAGE USING THE SAME

CROSS-REFERENCE TO RELATED APPLICATIONS

This application claims priority to Chinese Patent Application No. 201710727959.9 filed on Aug. 23, 2017, the contents of which are incorporated by reference herein.

FIELD

The subject matter herein generally relates to safe power consuming field, and particularly to an electrical leakage detection shoe and a method for detecting electrical leakage using the shoe.

BACKGROUND

There are many conducting or semi-conducting cables buried under grounds of a city. With on-going city construction, the cables may be broken or damaged, and the cables may cause electrical leakage on a rainy day. Then, a user standing or walking on a wet ground with the electrical leakage may get electrocuted.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
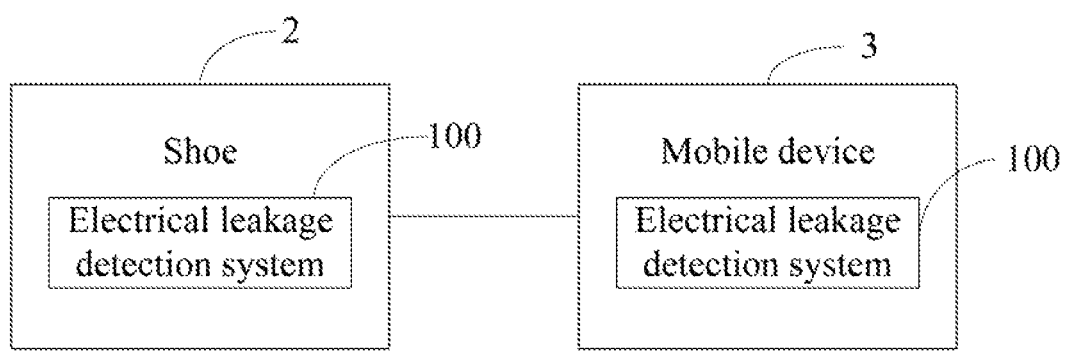
FIG. 1 is a schematic diagram of one exemplary embodiment of a running environment of an electrical leakage detection system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. It should be noted that references to "an" or "one" embodiment in this disclosure are not necessarily to the same embodiment, and such references mean "at least one."

The term "module", as used herein, refers to logic embodied in hardware or firmware, or to a collection of software instructions, written in a programming language, such as, Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY™, flash memory, and hard disk drives. The term "comprising" means "including, but not necessarily limited to"; it specifically indicates open-ended inclusion or membership in a so-described combination, group, series and the like.

FIG. 1 is a block diagram of one exemplary embodiment of a running environment of an electrical leakage detection system 100. The electrical leakage detection system 100 is running in an environment constituted by a shoe 2 and a mobile device 3. The shoe 2 has a function to detect electrical leakage. In at least one exemplary embodiment, the shoe 2 can communicate with the mobile device 3. When a user is wearing the shoe 2 and carrying the mobile device 3, the electrical leakage detection system 100 can control the shoe 2 to detect where a source of the electrical leakage is on the wet ground around the user, and send a detection result to the mobile device 3 to prompt the user to leave the wet ground. In at least one exemplary embodiment, the source of the electrical leakage can be an electrically conductive object that is in electric leakage. For example, the source of the electrical leakage may be a conducting or semi-conducting cable that is broken or damaged. Then, a user standing or walking on the wet ground with the electrical leakage may get electrocuted. In at least one exemplary embodiment, the mobile device 3 can be a smart phone, a tablet computer, or a wearable device (e.g., a watch or a bracelet).

Figure 2:
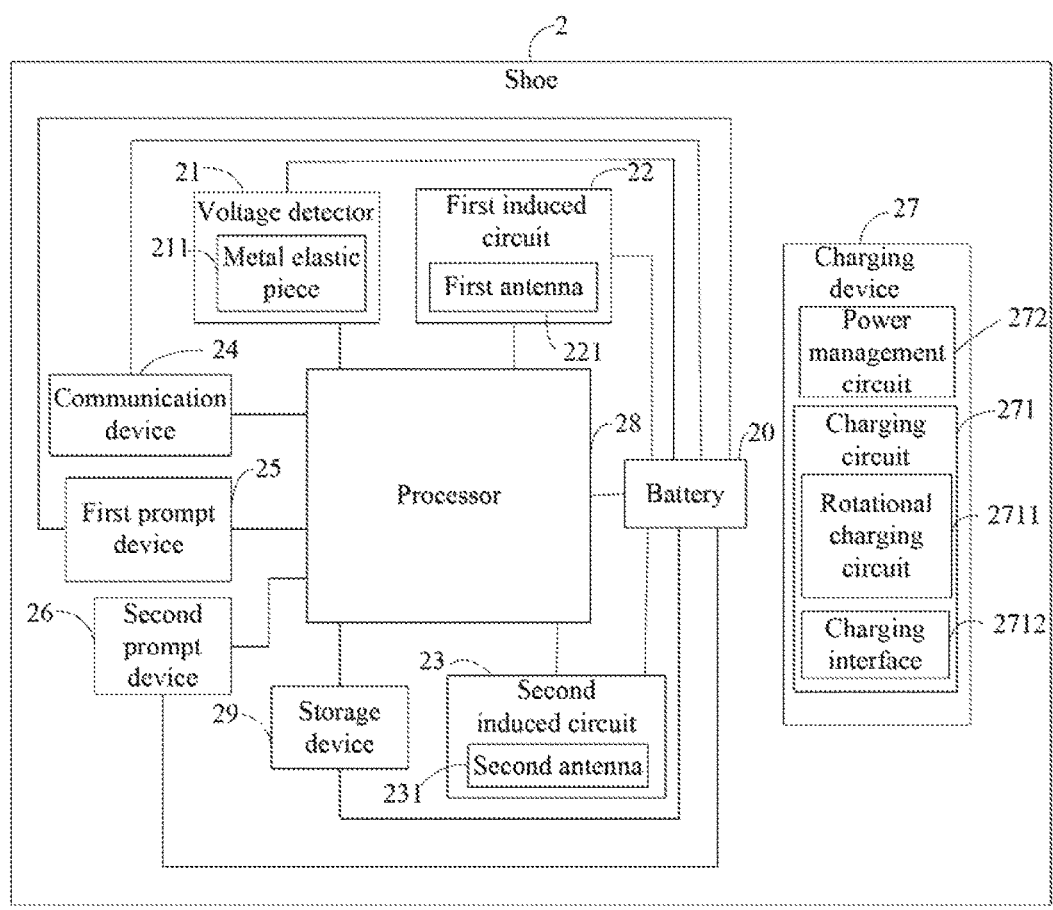
FIG. 2 is a schematic diagram of one exemplary embodiment of a shoe of FIG. 1.

FIG. 2 is a block diagram of one exemplary embodiment of a running environment of an electrical leakage detection system 100. Depending on the embodiment, the shoe 2 can include, but is not limited to, a battery 20, a voltage detector 21, a first induced circuit 22, a second induced circuit 23, a communication device 24, a first prompt device 25, a second prompt device 26, a charging device 27, a processor 28 and a storage device 29. The first prompt device 25 can be an indicator light. The battery 20 can supply power to the voltage detector 21, the first induced circuit 22, the second induced circuit 23, the communication device 24, the first prompt device 25, the second prompt device 26, the charging device 27, the processor 28, and the storage device 29. FIG. 2 illustrates only one example of the shoe 2 that can include more or fewer components than illustrated, or have a different configuration of the various components in other embodiments.

In at least one exemplary embodiment, the voltage detector 21 can detect where the source of an electrical leakage is when the user passes by the wet ground. The voltage detector 21 can include a metal elastic piece 211. The voltage detector 21 can detect a voltage value of the source of the electrical leakage by the metal elastic piece 211. In at least one exemplary embodiment, the voltage detector 21 is a circuit for detecting the voltage of the source of the electrical leakage.

In at least one exemplary embodiment, the first induced circuit 22 can detect electromagnetic field strength between the shoe 2 and the source of the electrical leakage. The first induced circuit 22 can include a first antenna 221. The first induced circuit 22 can detect the electromagnetic field strength by the first antenna 221. In at least one exemplary embodiment, the first induced circuit 22 is an electromagnetic induction circuit.

In at least one exemplary embodiment, the second induced circuit 23 includes second antennas 231, and number of the second antennas 231 is three. Each of the second antennas 231 can calculate the electromagnetic field strength between the source of the electrical leakage and each of the second antennas 231. In at least one exemplary embodiment, the second induced circuit 23 is a magnetic induction circuit.

In at least one exemplary embodiment, the communication device 24 can communicate with the mobile device 3 through BLUETOOTH or WIFI.

In at least one exemplary embodiment, the first prompt device 25 can be an indicator light, and indicating working status of the shoe 2.

In at least one exemplary embodiment, the second prompt device 26 can generate prompt messages to inform the user where the source of the electrical leakage is on the wet ground.

In at least one exemplary embodiment, the charging device 27 can charge the battery 20. The charging device 27 includes a charging circuit 271 and a power management circuit 272. The charging circuit 271 includes a rotational charging circuit 2711. The rotational charging circuit 2711 is embedded into bottom of the shoe 2, and the rotational charging circuit 2711 includes a coil and a fixed magnet (not shown). When the walking user is wearing the shoe 2, the coil of the rotational charging circuit 2711 will rotate, and the coil will cut the magnetic field generated by the fixed magnet. Then, the rotational charging circuit 2711 will charge the battery 20. In other exemplary embodiments, the charging circuit 271 further includes a charging interface 2712. The charging interface 2712 can connect to an external power supply. The external power supply can charge the battery 20 through the charging interface 2712.

In at least one exemplary embodiment, the power management circuit 272 can detect a voltage value of the battery 20, and determine whether the battery 20 is in a charge saturation status according to the voltage value. When the battery 20 is in the charge saturation status, the power management circuit 272 will control the charging circuit 271 to stop charging. Therefore, when the battery 20 is in the charge saturation status, even if the user is walking, the charging circuit 271 will stop charging the battery 20.

In at least one exemplary embodiment, the storage device 29 can include various types of non-transitory computer-readable storage mediums. For example, the storage device 29 can be an internal storage system, such as a flash memory, a random access memory (RAM) for temporary storage of information, and/or a read-only memory (ROM) for permanent storage of information. The storage device 29 can also be an external storage system, such as a hard disk, a storage card, or a data storage medium.

In at least one exemplary embodiment, the processor 28 can be a central processing unit (CPU), a microprocessor, or other data processor chip that performs functions of the electrical leakage detection system 100 of the shoe 2.

Figure 3:
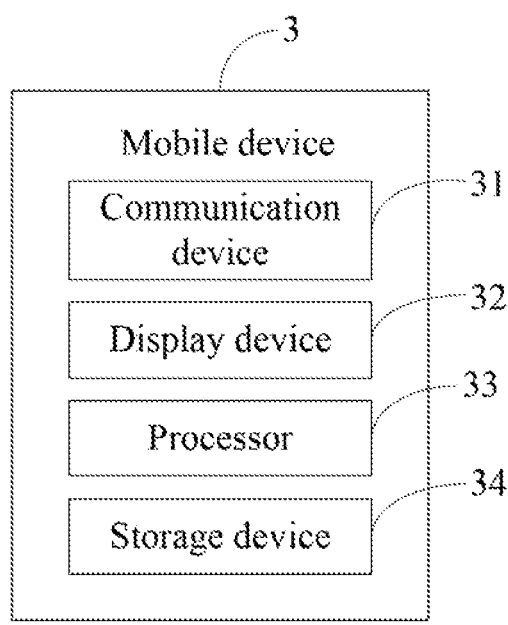
FIG. 3 is a schematic diagram of one exemplary embodiment of a mobile device of FIG. 1.

FIG. 3 is a block diagram of an example embodiment of a mobile device 3. Depending on the embodiment, the mobile device 3 can include, but is not limited to, a communication device 31, a display device 32, a processor 33 and a storage device 34.

In at least one exemplary embodiment, the communication device 31 can communicate with the communication device 24 of the shoe 2 through BLUETOOTH or WIFI.

In at least one exemplary embodiment, the display device 32 can display at least one object (e.g., word or image). The display device 32 may be a touch panel.

In at least one exemplary embodiment, the storage device 34 can store the electrical leakage detection system 100. The storage device 34 can be an internal storage system, and also can be an external storage system.

In at least one exemplary embodiment, the processor 33 can be a central processing unit (CPU), a microprocessor, or other data processor chip.

Figure 4:
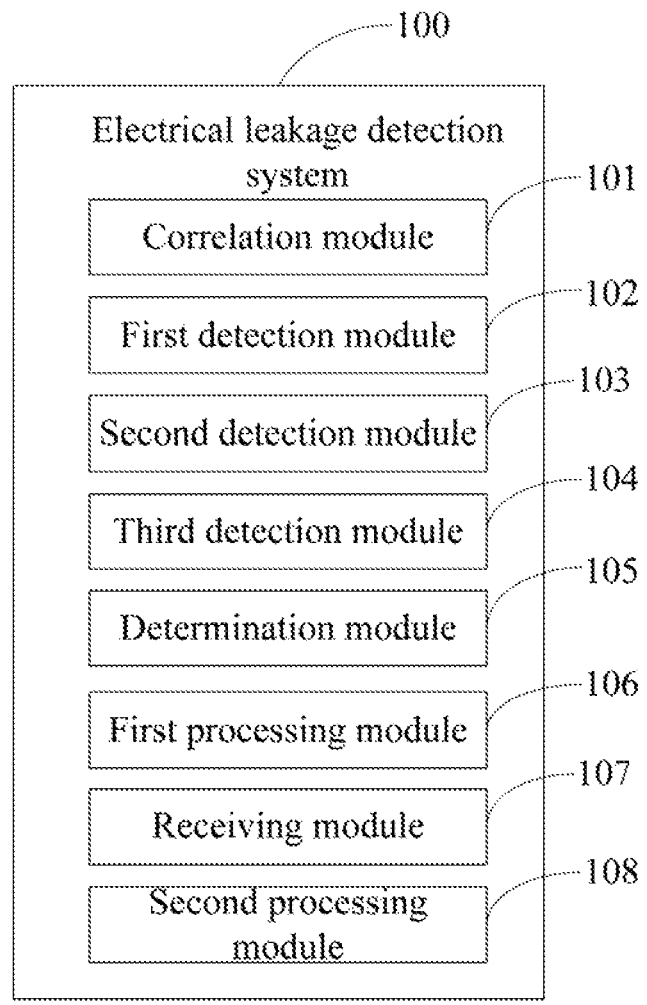
FIG. 4 is a schematic diagram of one exemplary embodiment of modules of the electrical leakage detection system of FIG. 1.

FIG. 4 is a block diagram of one embodiment of function modules of the electrical leakage detection system 100. In at least one exemplary embodiment, the electrical leakage detection system 100 can include a correlation module 101, a first detection module 102, a second detection module 103, a third detection module 104, a determination module 105, a first processing module 106, a receiving module 107, and a second processing module 108. The function modules 102-106 can include computerized codes in the form of one or more programs which are stored in the storage device 29 of the shoe 2. When the shoe 2 runs the electrical leakage detection system 100, the processor 28 executes the computerized codes to provide functions of the function modules 102-106. The function modules 101, 107, and 108 can include computerized codes in the form of one or more programs which are stored in the storage device 33 of the mobile device 3. When the mobile device 3 runs the electrical leakage detection system 100, the processor 33 executes the computerized codes to provide functions of the function modules 101, 107, and 108.

Figure 5:
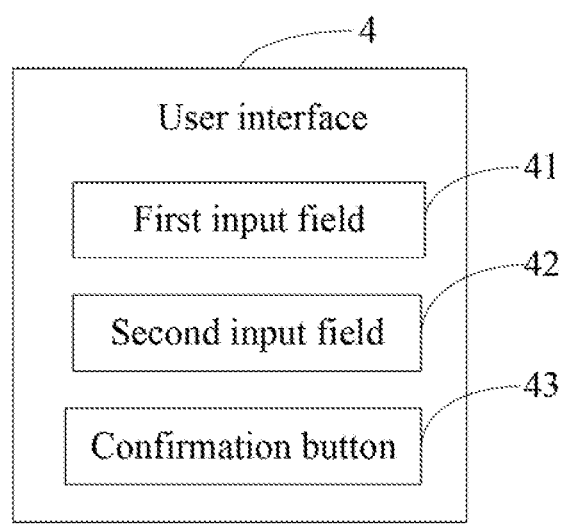
FIG. 5 illustrates an example of a correlation interface of the mobile device of FIG. 3.

In at least one exemplary embodiment, the correlation module 101 can interconnect the shoe 2 and the mobile device 3. The shoe 2 includes a first identification code, and the first identification code represents an identity of the shoe 2. The mobile device 3 includes a second identification code, and the second identification code represents an identity of the mobile device 3. The first identification code can include numbers and letters. The second identification code can include numbers and letters too. The correlation module 101 can interconnect the shoe 2 and the mobile device 3 by receiving a combination operation. The combination operation is establishing correspondence between the first identification code of the shoe 2 and the second identification code of the mobile device 3. For example, the correlation module 101 can supply a user interface 4 (as shown in FIG. 5) displaying on the display device 32. The user interface 4 includes a first input field 41, a second input field 42, and a confirmation button 43. The first input field 41 can receive the first identification code of the shoe 2 input by the user. The second input field 42 can receive the second identification code of the mobile device 3 input by the user. The confirmation button 43 can respond to a press operation input by the user to combine the first identification code and the second identification code.

In at least one exemplary embodiment, the first detection module 102 can acquire the voltage of the source of the electrical leakage detected by the voltage detector 21. In at least one exemplary embodiment, the voltage detector 21 can include four metal elastic pieces 211. Two metal elastic pieces 211 are set on the top of a shoe 2 and the other two metal elastic pieces 211 are set on the heel of the shoe 2. When the user walks on the wet ground with the shoe 2, at least one of the four metal elastic pieces 211 may electrically connected to the source of the electrical leakage, the voltage detector 21 can detect the voltage of the source of the electrical leakage. Then, the first detection module 102 can acquire the voltage of the source of the electrical leakage from the voltage detector 21.

In at least one exemplary embodiment, the second detection module 103 can acquire a distance between the shoe 2 and the source of the electrical leakage according to the electromagnetic field strength detected by the first induced circuit 22. The first induced circuit 22 can detect the electromagnetic field strength by the first antenna 221, and the second detection module 103 can acquire the distance according to the electromagnetic field strength.

Figure 6:
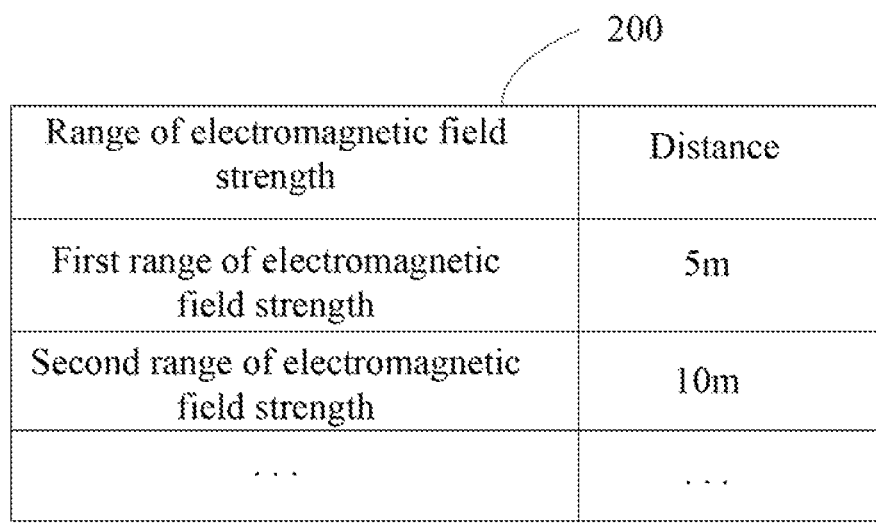
FIG. 6 illustrates an example of a corresponding relation table of the shoe of FIG. 2.

In at least one exemplary embodiment, the second detection module 103 can acquire an analog electromagnetic signal of the source of the electrical leakage, and filter the analog electromagnetic signal to eliminate noise. The second detection module 103 can amplify the filtered electromagnetic signal and acquire the electromagnetic field strength by conversion to digital data. The second detection module 103 can acquire the distance by looking up a relation table 200 (as shown in FIG. 6). The relation table 200 represents relationships between electromagnetic field strengths and distances. For example, when the distance is 5 meters, the first induced circuit 22 can detect electromagnetic field strengths and assemble the detected electromagnetic field strengths to constitute a first range of electromagnetic field strengths. When the distance is 10 meters, the first induced circuit 22 can detect electromagnetic field strengths and assemble the detected electromagnetic field strengths to constitute a second range of electromagnetic field strengths. The relation table 200 can be pre-stored in the storage device 29.

Figure 7:
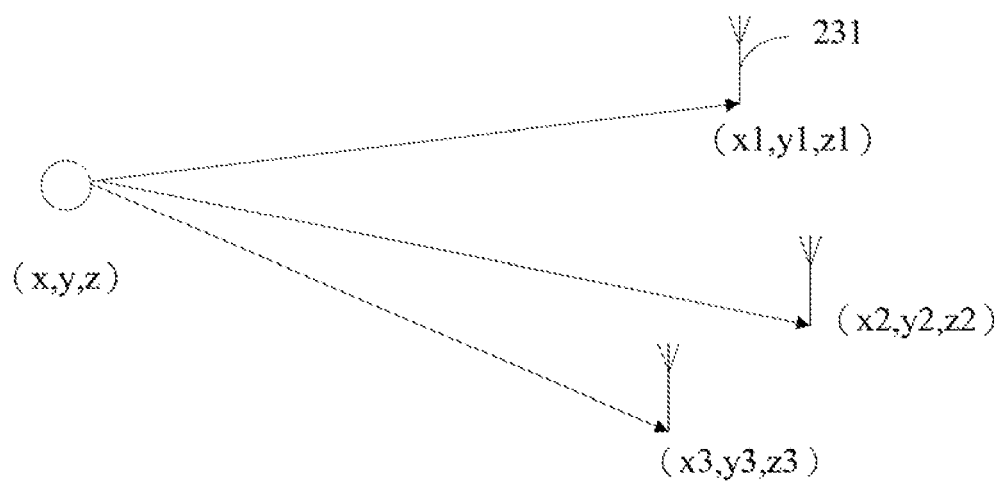
FIG. 7 illustrates an example of coordinates of second antennas and a source of the electrical leakage.

In at least one exemplary embodiment, the second detection module 103 can determine a direction from the shoe 2 to the source of the electrical leakage by the second induced circuit 23. In at least one exemplary embodiment, the number of the second antennas 231 of the second induced circuit 23 is three. Each of the second antennas 231 is on different position of the shoe 2. The second detection module 103 can establish a space rectangular coordinate system and an origin of the space rectangular coordinate system is the position of one of the second antennas 231. The positions of the other second antennas 231 are known because the other second antennas 231 are fixed on the shoe 2. As shown in FIG. 7, coordinates of the position of the second antennas 231 are (x1, y1, z1), (x2, y2, z2), and (x3, y3, z3). The coordinate of the position of the source of the electrical leakage is (x, y, z). The distances between the positions of the second antennas 231 and the source of the electrical leakage are l1, l2, and l3. Then, the second detection module 103 can calculate the coordinate of the position of the source of the electrical leakage (x, y, z) from this formula:

$$\begin{cases} [(x1-x)^2+(y1-y)^2+(z1-z)^2]^{1/2} = l1 \\ [(x2-x)^2+(y2-y)^2+(z2-z)^2]^{1/2} = l2. \\ [(x3-x)^2+(y3-y)^2+(z3-z)^2]^{1/2} = l3 \end{cases}$$

The second detection module 103 can determine the direction from the shoe 2 to the source of the electrical leakage according to the coordinate of the position of the source of the electrical leakage (x, y, z).

In at least one exemplary embodiment, the determination module 105 can determine whether the voltage of the source of the electrical leakage is greater than a predetermined voltage. The predetermined voltage is a reference value (e.g., 12V) representing a safe voltage, and can be pre-set. When the voltage of the source of the electrical leakage is greater than the predetermined voltage, it is determined that the voltage of the source of the electrical leakage is at a harmful level. When the voltage of the source of the electrical leakage is less than or equal to the predetermined voltage, it is determined that the voltage level of the source of the electrical leakage is safe.

In at least one exemplary embodiment, the first processing module 106 can send the voltage, the distance, and the direction to the mobile device 3 when the voltage is greater than the predetermined voltage. The first processing module 106 further can control the second prompt device 26 to generate prompt messages to inform the user that the source of the electrical leakage exists around him/her. In one embodiment, the second prompt device 26 can be a motor. The first processing module 106 can control the motor to vibrate to inform the user that the source of the electrical leakage is around him/her when the voltage is greater than the predetermined voltage. In another embodiment, the second prompt device 26 can be an LED light. The first processing module 106 can control the LED light to flash to inform the user that the source of the electrical leakage is around him/her when the voltage is greater than the predetermined voltage.

In at least one exemplary embodiment, the first processing module 106 can control the first prompt device 25 to show a working status of the shoe 2. For example, the first prompt device 25 includes a yellow indicator light, a green indicator light and a red indicator light. The first processing module 106 can control the yellow indicator light to flash, to indicate that the shoe 2 is being charged when the charging device 27 is charging the battery 20. The first processing module 106 can control the green indicator light to flash to indicate that the shoe 2 is fully charged. The first processing module 106 can control the red indicator light to flash, to indicate that a source of dangerous electrical leakage exists around the user when the voltage is greater than the predetermined voltage.

In at least one exemplary embodiment, the receiving module 107 can receive the voltage, the distance, and the direction from the shoe 2.

Figure 8:
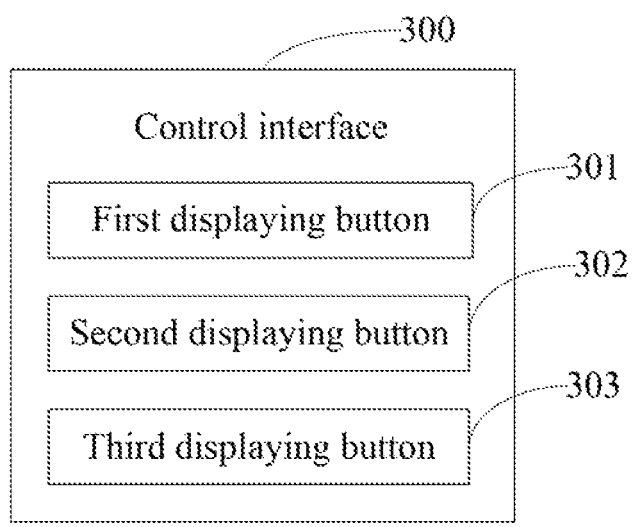
FIG. 8 illustrates an example of a control interface of the mobile device of FIG. 3.

In at least one exemplary embodiment, the second processing module 108 can supply a control interface 300 (as shown in FIG. 8) displaying the voltage, the distance, and the direction on the display device 32. The control interface 300 includes, but is not limited to, a first displaying button 301, a second displaying button 302, and a third displaying button 303. The second processing module 108 can respond to a press operation on the first displaying button 301 inputs by the user to display the voltage on the control interface 300. The second processing module 108 can respond to a press operation on the second displaying button 302 inputs by the user to display the distance on the control interface 300. The second processing module 108 can respond to a press operation on the third displaying button 303 inputs by the user to display the direction on the control interface 300. In one embodiment, the second processing module 108 can display the direction as an image on the control interface 300. For example, the image may include the coordination of the shoe 2, the coordination of the source of the electrical leakage, and an arrow from the coordination of the shoe 2 to the source of the electrical leakage. Then, the second processing module 108 can indicate the direction as the arrow.

Figure 9:
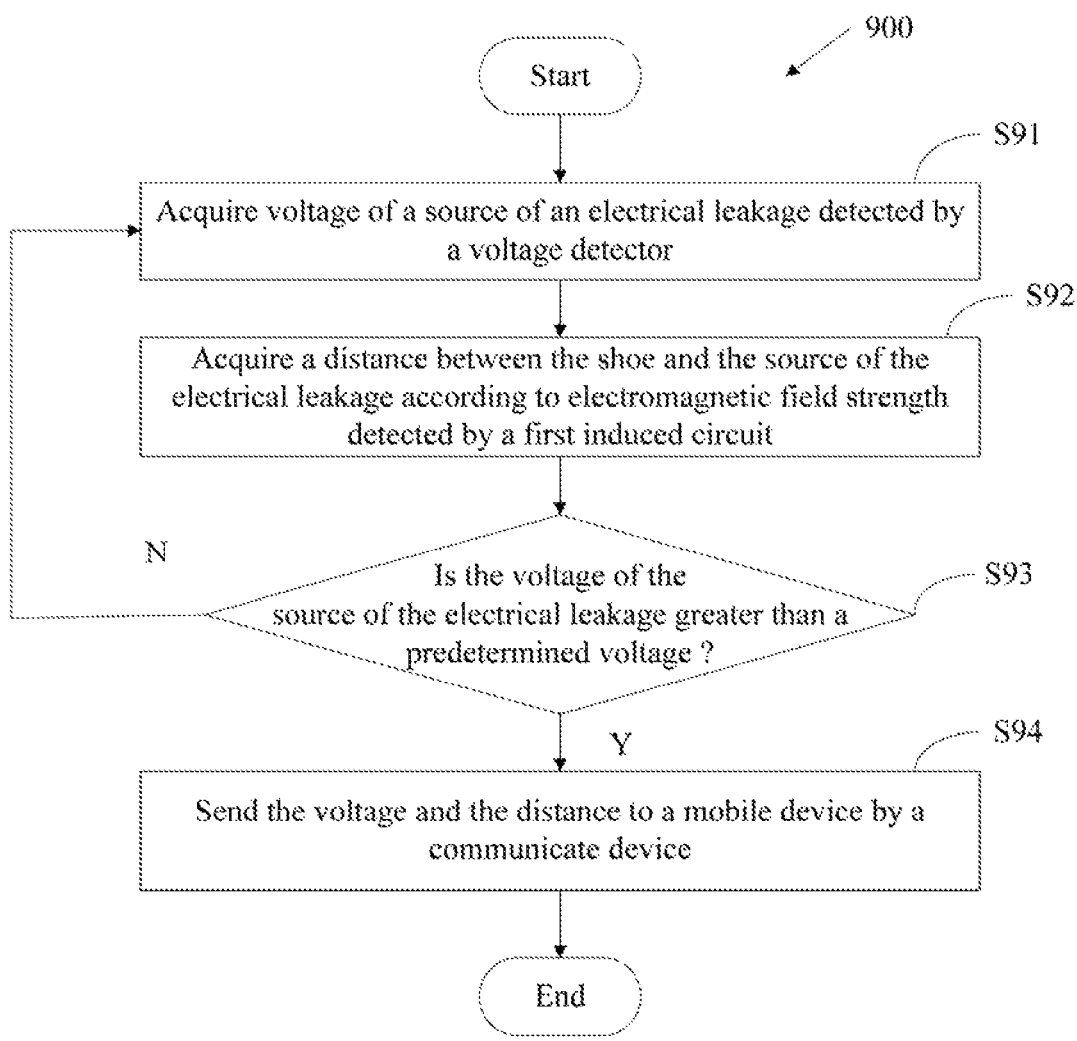
FIG. 9 illustrates a flowchart of one embodiment of a method for detecting the electrical leakage using the shoe of FIG. 2.

FIG. 9 illustrates a flowchart which is presented in accordance with an example embodiment. The exemplary method 900 is provided by way of example, as there are a variety of ways to carry out the method. The method 900 described below can be carried out using the configurations illustrated in FIG. 4, for example, and various elements of these figures are referenced in explaining exemplary method 900. Each block shown in FIG. 9 represents one or more processes, methods, or subroutines, carried out in the exemplary method 900. Additionally, the illustrated order of blocks is by example only and the order of the blocks can be changed according to the present disclosure. The exemplary method 900 can begin at block S91. Depending on the embodiment, additional steps can be added, others removed, and the ordering of the steps can be changed.

At block S91, the first detection module 102 can acquire the voltage of the source of the electrical leakage detected by the voltage detector 21. In at least one exemplary embodiment, the voltage detector 21 can include four metal elastic pieces 211. Two metal elastic pieces 211 are set on the top of a shoe 2 and the other two metal elastic pieces 211 are set on the heel of the shoe 2. When the user walks on the wet ground with the shoe 2, at least one of the four metal elastic pieces 211 may electrically connected to the source of the electrical leakage, the voltage detector 21 can detect the voltage of the source of the electrical leakage. Then, the first detection module 102 can acquire the voltage of the source of the electrical leakage from the voltage detector 21.

At block S92, the second detection module 103 can acquire a distance between the shoe 2 and the source of the electrical leakage according to the electromagnetic field strength detected by the first induced circuit 22. The first induced circuit 22 can detect the electromagnetic field strength by the first antenna 221, and the second detection module 103 can acquire the distance according to the electromagnetic field strength.

In at least one exemplary embodiment, the second detection module 103 can acquire an analog electromagnetic signal of the source of the electrical leakage, and filter the analog electromagnetic signal to eliminate noise. The second detection module 103 can amplify the filtered electromagnetic signal and acquire the electromagnetic field strength by conversion to digital data. The second detection module 103 can acquire the distance by looking up a relation table 200 (as shown in FIG. 6). The relation table 200 represents relationships between electromagnetic field strengths and distances. For example, when the distance is 5 meters, the first induced circuit 22 can detect electromagnetic field strengths and assemble the detected electromagnetic field strengths to constitute a first range of electromagnetic field strengths. When the distance is 10 meters, the first induced circuit 22 can detect electromagnetic field strengths and assemble the detected electromagnetic field strengths to constitute a second range of electromagnetic field strengths. The relation table 200 can be pre-stored in the storage device 29.

At block S93, the determination module 105 can determine whether the voltage of the source of the electrical leakage is greater than a predetermined voltage. The predetermined voltage is a reference value (e.g., 12V) representing a safe voltage, and can be pre-set. When the voltage of the source of the electrical leakage is greater than the predetermined voltage, the process goes to block S94. When the voltage of the source of the electrical leakage is less than or equal to the predetermined voltage, the process returns to block S91.

At block S94, the first processing module 106 can send the voltage and the distance to the mobile device 3 by the communicate device 24.

In at least one exemplary embodiment, the method further include a step before block S91, the correlation module 101 can interconnect the shoe 2 and the mobile device 3. The shoe 2 includes a first identification code, and the first identification code represents an identity of the shoe 2. The mobile device 3 includes a second identification code, and the second identification code represents an identity of the mobile device 3. The first identification code can include numbers and letters. The second identification code can include numbers and letters too. The correlation module 101 can interconnect the shoe 2 and the mobile device 3 by receiving a combination operation. The combination operation is establishing correspondence between the first identification code of the shoe 2 and the second identification code of the mobile device 3. For example, the correlation module 101 can supply a user interface 4 (as shown in FIG. 5) displaying on the display device 32. The user interface 4 includes a first input field 41, a second input field 42, and a confirmation button 43. The first input field 41 can receive the first identification code of the shoe 2 input by the user. The second input field 42 can receive the second identification code of the mobile device 3 input by the user. The confirmation button 43 can respond to a press operation input by the user to combine the first identification code and the second identification code.

In at least one exemplary embodiment, the method further include a step after the block S92, the second detection module 103 can determine a direction from the shoe 2 to the source of the electrical leakage by the second induced circuit 23. In at least one exemplary embodiment, the number of the second antennas 231 of the second induced circuit 23 is three. Each of the second antennas 231 is on different position of the shoe 2. The second detection module 103 can establish a space rectangular coordinate system and an origin of the space rectangular coordinate system is the position of one of the second antennas 231. The positions of the other second antennas 231 are known because the other second antennas 231 are fixed on the shoe 2. As shown in FIG. 7, coordinates of the position of the second antennas 231 are (x1, y1, z1), (x2, y2, z2), and (x3, y3, z3). The coordinate of the position of the source of the electrical leakage is (x, y, z). The distances between the positions of the second antennas 231 and the source of the electrical leakage are l1, l2, and l3. Then, the second detection module 103 can calculate the coordinate of the position of the source of the electrical leakage (x, y, z) from this formula:

$$\begin{cases} [(x1-x)^2 + (y1-y)^2 + (z1-z)^2]^{1/2} = l1 \\ [(x2-x)^2 + (y2-y)^2 + (z2-z)^2]^{1/2} = l2. \\ [(x3-x)^2 + (y3-y)^2 + (z3-z)^2]^{1/2} = l3 \end{cases}$$

The second detection module 103 can determine the direction from the shoe 2 to the source of the electrical leakage according to the coordinate of the position of the source of the electrical leakage (x, y, z).

In at least one exemplary embodiment, the method further include a step after the block S93, the first processing module 106 further can control the second prompt device 26 to generate prompt messages to inform the user that the source of the electrical leakage exits around him/her. In one embodiment, the second prompt device 26 can be a motor. The first processing module 106 can control the motor to vibrate to inform the user that the source of the electrical leakage is around him/her when the voltage is greater than the predetermined voltage. In another embodiment, the second prompt device 26 can be an LED light. The first processing module 106 can control the LED light to flash to inform the user that the source of the electrical leakage is around him/her when the voltage is greater than the predetermined voltage.

In at least one exemplary embodiment, the first processing module 106 can control the first prompt device 25 to show a working status of the shoe 2. For example, the first prompt device 25 includes a yellow indicator light, a green indicator light and a red indicator light. The first processing module 106 can control the yellow indicator light to flash, to indicate that the shoe 2 is being charged when the charging device 27 is charging the battery 20. The first processing module 106 can control the green indicator light to flash to indicate that the shoe 2 is fully charged. The first processing module 106 can control the red indicator light to flash, to indicate that a source of dangerous electrical leakage exists around the user when the voltage is greater than the predetermined voltage.

In at least one exemplary embodiment, the method further include a step after the block S94, the receiving module 107 can receive the voltage, the distance and the direction from the shoe 2. In at least one exemplary embodiment, the second processing module 108 can supply a control interface 300 (as shown in FIG. 8) displaying the voltage, the distance, and the direction on the display device 32. The control interface 300 includes, but is not limited to, a first displaying button 301, a second displaying button 302, and a third displaying button 303. The second processing module 108 can respond to a press operation on the first displaying button 301 inputs by the user to display the voltage on the control interface 300. The second processing module 108 can respond to a press operation on the second displaying button 302 inputs by the user to display the distance on the control interface 300. The second processing module 108 can respond to a press operation on the third displaying button 303 inputs by the user to display the direction on the control interface 300. In one embodiment, the second processing module 108 can display the direction as an image on the control interface 300. For example, the image may include the coordinate of the shoe 2, the coordinate of the source of the electrical leakage, and an arrow from the coordinate of the shoe 2 to the source of the electrical leakage. Then, the second processing module 108 can indicate the direction as the arrow.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. An electrical leakage detecting method comprising:
   acquiring a voltage of a source of an electrical leakage detected by a voltage detector of a shoe when a user is wearing the shoe on wet ground;
   acquiring electromagnetic field strength between the source of the electrical leakage and the shoe by a first induced circuit of the shoe;
   acquiring a distance between the shoe and the source of the electrical leakage;
   determining whether the voltage of the source of the electrical leakage is greater than a predetermined voltage; and
   sending the voltage and the distance to a mobile device when the voltage of the source of the electrical leakage is greater than the predetermined voltage.

2. The method according to claim 1, wherein the electromagnetic field strength is acquired by:
   acquiring an electromagnetic signal of the source of the electrical leakage by a first antenna of the first induced circuit;
   filtering the electromagnetic signal to eliminate noise; and
   amplifying the filtered electromagnetic signal and acquiring the electromagnetic field strength by converting the amplified electromagnetic signal to digital signal.

3. The method according to claim 1, wherein the distance is acquired by inquiring a relation table that represents relationships between electromagnetic field strengths and distances.

4. The method according to claim 1, wherein the method further comprising:
   determining a direction from the shoe to the source of the electrical leakage; and
   sending the direction from the shoe to the source of the electrical leakage to the mobile device when the voltage of the source of the electrical leakage is greater than the predetermined voltage.

5. The method according to claim 1, wherein the method further comprising:
   generating prompt messages to inform the user that the source of the electrical leakage exists around the user when the voltage of the source of the electrical leakage is greater than the predetermined voltage.

6. A shoe comprising:
   a voltage detector, configured to detect a voltage of a source of an electrical leakage when a user is wearing the shoe on wet ground;
   a first induced circuit, configured to acquire electromagnetic field strength between the source of the electrical leakage and the shoe;
   a communication device, configured to communication connect with a mobile device;
   a processor, wherein the processor is electrically connected to the voltage detector, the first induced circuit, and the communication device;

the processor configured to acquire the voltage of the source of the electrical leakage;
acquire the electromagnetic field strength between the source of the electrical leakage and the shoe;
acquire the distance between the shoe and the source of the electrical leakage;
determine whether the voltage of the source of the electrical leakage is greater than a predetermined voltage; and
send the voltage and the distance to the mobile device when the voltage of the source of the electrical leakage is greater than the predetermined voltage.

7. The shoe according to claim 6, wherein the electromagnetic field strength is acquired by:
acquiring an electromagnetic signal of the source of the electrical leakage by a first antenna of the first induced circuit;
filtering the electromagnetic signal to eliminate noise; and
amplifying the filtered electromagnetic signal and acquiring the electromagnetic field strength by converting the amplified electromagnetic signal to digital signal.

8. The shoe according to claim 6, wherein the distance is acquired by inquiring a relation table that represents relationships between electromagnetic field strengths and distances.

9. The shoe according to claim 6, wherein the processor further configured to:
determine a direction from the shoe to the source of the electrical leakage; and
send the direction from the shoe to the source of the electrical leakage to the mobile device when the voltage of the source of the electrical leakage is greater than the predetermined voltage.

10. The shoe according to claim 6, wherein the processor further configured to:
generate prompt messages to inform the user that the source of the electrical leakage exists around the user when the voltage of the source of the electrical leakage is greater than the predetermined voltage.

11. The shoe according to claim 10, wherein the prompt messages comprises vibration generated by a motor of the shoe, and flash light generated by a LED light of the shoe.

* * * * *